(12) United States Patent
Sarstedt

(10) Patent No.: US 6,548,341 B2
(45) Date of Patent: Apr. 15, 2003

(54) PROCESS FOR PRODUCING A FIRST ELECTRODE AND A SECOND ELECTRODE, ELECTRONIC COMPONENT AND ELECTRONIC MEMORY ELEMENT

(75) Inventor: Margit Sarstedt, Leuven (BE)

(73) Assignee: Infineon Technologies, AG (DE)

( * ) Notice: Subject to any disclaimer, the term of this patent is extended or adjusted under 35 U.S.C. 154(b) by 0 days.

(21) Appl. No.: 09/912,039

(22) Filed: Jul. 24, 2001

(65) Prior Publication Data

US 2002/0132420 A1 Sep. 19, 2002

(30) Foreign Application Priority Data

Aug. 9, 2000 (DE) .......................................... 100 38 894

(51) Int. Cl.$^7$ ..................... H01L 21/8242; H01L 21/20; H01L 21/44
(52) U.S. Cl. ........................ 438/239; 438/399; 438/680; 438/683; 438/685
(58) Field of Search ................. 438/166, 162, 438/238, 239, 242, 268, 270, 271, 386, 399, 680, 683, 685, 732; 257/213, 613, 616, 631, 633

(56) References Cited

U.S. PATENT DOCUMENTS

| | | | |
|---|---|---|---|
| 5,378,905 A | * | 1/1995 | Nakamura ................ 257/213 |
| 5,736,438 A | * | 4/1998 | Nishimura et al. . 257/29.286 E |
| 6,099,574 A | * | 8/2000 | Fukuda et al. ................ 703/14 |
| 6,103,587 A | | 8/2000 | Nakabeppu |
| 6,303,483 B1 | * | 10/2001 | Kunikiyo .................... 438/592 |
| 6,316,799 B1 | * | 11/2001 | Kunikiyo .................... 257/296 |
| 2002/0074582 A1 | * | 6/2002 | Hiratani et al. ............. 257/296 |

FOREIGN PATENT DOCUMENTS

JP  9-232543  9/1997

OTHER PUBLICATIONS

T. Hihara und K. Sumlyama, Formation and size control of a Nl cluster by plasma gas condensation, Journal for Applied Physics, vol. 64, No. 9, S. 5270–5275, Nov. 1998.

S. G. Halt, M. B. Nielsen and R. E. Palmer, Energetic impact of amail Ag clusters on graphite, Journal for Applied Physics, vol. 83, No. 2, S. 733–737, Jan. 1998.

B. V. Issendorff und R. E. Palmer, A new high transmission infinite range mass selector for cluster and nanoparticle beams, Review of Scientific Instruments, vol. 70, No. 12, S. 4497–4501, Dec. 1999.

I. M. Goldby et al, Gas condensation source for production and deposition of size–selected metal clusters, Rev. Sci. Instrum. 66, (9), S. 3327–3334, Sep. 1997.

* cited by examiner

*Primary Examiner*—Michael S. Lebentritt
(74) *Attorney, Agent, or Firm*—Jeffrey R. Stone; Briggs and Morgan, P.A.

(57) ABSTRACT

In a process for producing a first electrode and a second electrode, the first electrode and the second electrode are provided on an electrode material. A cluster ion source is used to apply clusters of the electrode material to the first electrode and/or the second electrode.

9 Claims, 3 Drawing Sheets

PROCESS FOR PRODUCING A FIRST ELECTRODE AND A SECOND ELECTRODE, ELECTRONIC COMPONENT AND ELECTRONIC MEMORY ELEMENT

The invention relates to a process for producing a first electrode and a second electrode, to an electronic component and to an electronic memory element.

For some applications in the microelectronics sector, it is desirable for the surface area of electrodes, for example of silicon electrodes or also metal electrodes, to be increased, in order, in this way, to achieve the maximum possible capacitance of the electrodes.

Enlarging the electrodes in the lateral direction is often out of the question, on account of the associated increase in space taken up by such an electrode and the resultant increase in size of an electronic component having a multiplicity of such electrodes.

For this reason, a technique for producing electrodes in which trenches are formed in a substrate has been developed, generally for electrode arrangements in three-dimensional structures in which the storage of the electrical charge carriers takes place in a stacked electrode arrangement or by using the vertically running electrodes arranged in the trenches.

However, a three-dimensional structure of this type very quickly encounters restrictions imposed by manufacturing technology, for example on account of the high aspect ratios of the trenches in which the electrodes are formed.

For this reason, it has been attempted, both when using horizontally running capacitive surfaces and vertically running capacitive surfaces, i.e. of electrodes, to increase the effective electrode surface areas while the macroscopic dimensions remain constant by roughening the respective electrode surfaces.

It is known to roughen an electrode surface, for example by means of a special etching method in order to increase the porosity of the surface or by applying additional spherical polysilicon structures to the surface of the electrodes, which are also known as hemispherical silicon grains (HSG).

During the application of spherical polysilicon structures, it is customary for polysilicon, i.e. polycrystalline silicon, to be grown onto the electrode surface which is to be roughened from a solution.

Hemispherical islands with a diameter of usually approximately 30 nm are formed on the electrode surface.

If, with a size of, for example, 30 nm, the density of these polysilicon islands is selected in such a manner that they position themselves at intervals of approximately 30 nm, it is possible to increase the surface area by well over 20%.

However, a drawback of this procedure is that the grain size of the individual hemispherical polysilicon islands which are formed cannot be controlled with accuracy and therefore an arrangement of this type can only be achieved at all with considerable process engineering problems and therefore high costs.

In the text which follows, the hemispherical islands which are formed on an electrode surface are also known as clusters.

Furthermore, [1] has disclosed a cluster ion source which is used to apply nickel clusters to a substrate surface.

In addition, it is known from [2] to form clusters from silver atoms on a graphite substrate.

Furthermore, [3] has disclosed a device for the mass separation of ion clusters, according to this particular example for the mass separation of silver clusters.

A further cluster ion source is described in [4].

[5] describes a process in which clusters of argon or phosphorus are applied to a polysilicon electrode.

Therefore, the invention is based on the problem of providing a process for producing a first electrode and a second electrode, as well as an electronic component which is formed using this method and an electronic memory element, in which it is possible for the grain size of the islands formed on the surfaces to be set more accurately.

The problem is solved by the process for producing a first electrode and a second electrode, the electronic component and the electronic memory element having the features described in the independent patent claims.

In a process for producing a first electrode and a second electrode, the first electrode and the second electrode are provided from an electrode material, which for example are integrated in a substrate, preferably in a silicon substrate.

A cluster ion source is used to apply clusters of the electrode material to the first electrode and/or second electrode.

The electrode material may be either polycrystalline silicon, i.e. polysilicon, or a metal which can in principle be selected as desired, such as nickel or silver.

The invention makes it possible, for the first time, to generate a beam profile in an accurately predeterminable manner, so that a predeterminable, if desired optimized, distribution of the clusters which are to be formed is ensured at the location of deposition, i.e. on the electrode surface of an electrode which is to be roughened.

Furthermore, the size of the clusters which are to be formed can be set very accurately.

A further advantage of the invention is that very accurate structuring of the clusters on an electrode surface is made possible in a simple and therefore inexpensive way.

According to one configuration of the invention, the electrode material may also be doped silicon, i.e. silicon clusters are formed on a silicon electrode which is doped with correspondingly desired doping atoms, the doping atoms being added to the ion beam, which is formed by the cluster ion source, comprising generated silicon ions, in a condensation area of the cluster ion source, with the result that the electrode material which is formed as clusters on the electrode surface has doped silicon clusters.

In principle, any desired electronic component which has electrodes formed in this way can be formed from the electrodes.

A preferred application area for an electrode formed in this way is electronic memories, for example an electronic memory element as a dynamic random access memory, i.e. a RAM, or a flash EEPROM.

The further development of the doping of ion beams generated in the condensation area of the cluster ion source allows very precise, simple and therefore inexpensive doping of the ion beam which was originally generated, so as to form a cluster which contains both the ions which were originally generated and the doping atoms, and therefore a cluster comprising a predeterminable number of doping atoms.

A further advantage of the invention resides in the fact that it is possible to form virtually (hemi-)spherical ion clusters, so that in this way it is potentially possible to achieve a further increase in the surface area of the electrode surface.

Furthermore, the invention makes it possible to produce cluster grain sizes which are significantly smaller than the grain sizes of the clusters which can be produced using the known method, so that even those areas of the electrode surface which adjoin relatively tight spaces may be suitable tor the area of the electrode surface to be increased.

Exemplary embodiments of the invention are illustrated in the figures and are explained in more detail below.

In the drawing:

FIG. 1 shows a cluster ion source 100 in accordance with a first exemplary embodiment of the invention.

Figure 1:
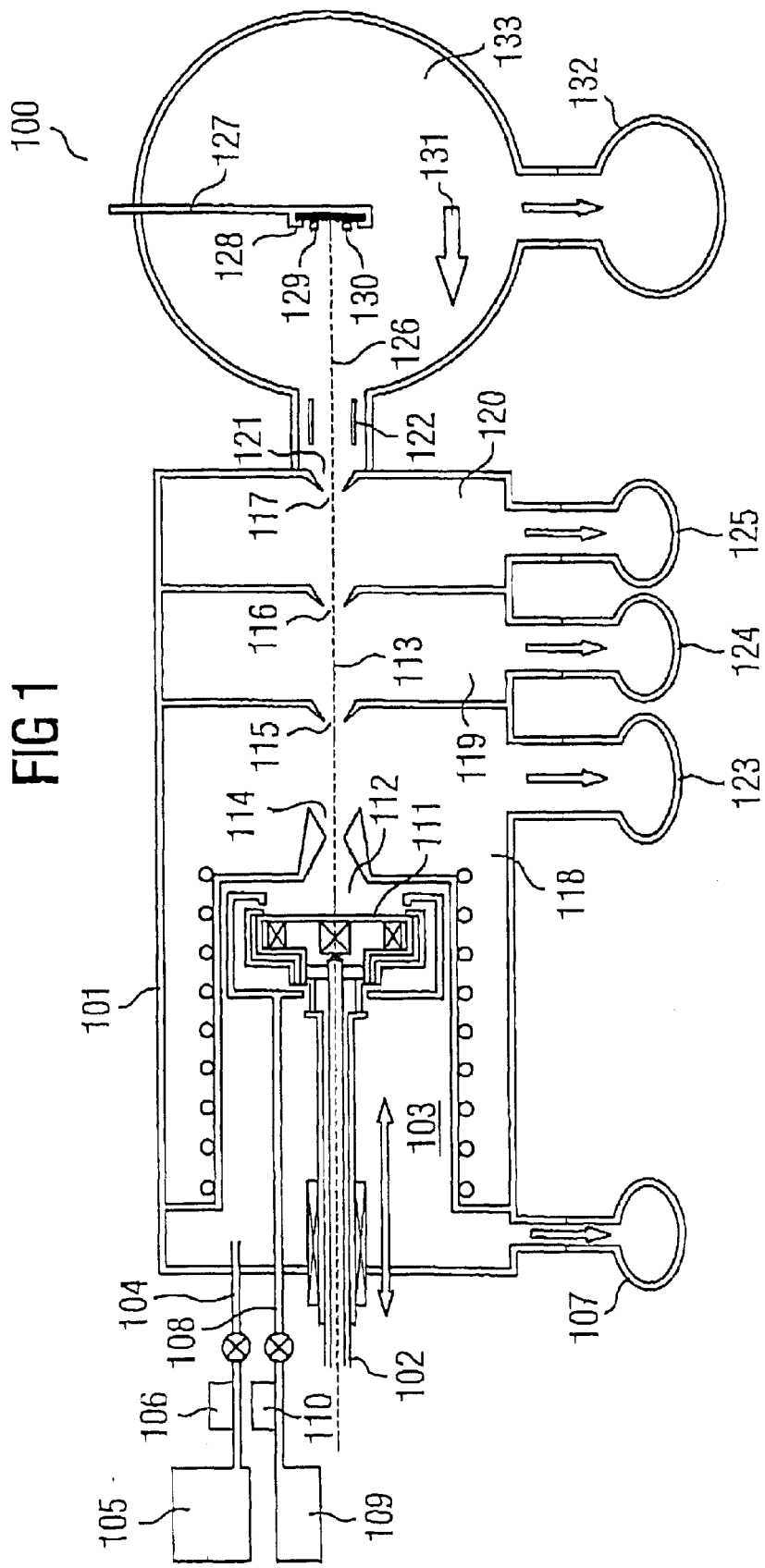
FIG. 1 shows a cluster ion source for producing an electrode arrangement with a roughened electrode surface in accordance with a first exemplary embodiment of the invention.

The cluster ion source 100 has fundamentally the same structure as the cluster ion source described in [1].

In a housing 101 of the cluster ion source 100 there is a cooling circuit 102 which is filled with cooling liquid, in accordance with this exemplary embodiment with cooling water.

In the housing 101 there is a principal chamber 103, which, via a first feed line 104, is fed with argon in the gas phase from a first gas vessel 105, which is filled with argon, as a continuous gas stream which is regulated by means of a first mass flow regulator 106.

The argon gas is supplied under a pressure of $T_{Si}=0.1$ to 0.4 kPa, which is generated in the principal chamber 103 by a turbomolecular pump 107 connected to the principal chamber 103.

Furthermore, the principal chamber 103 is fed, via a second feed line 108, with a doping gas, according to this exemplary embodiment with boron atoms, from a second gas vessel 109 which is filled with the doping gas, as a continuous or discrete gas stream, which is regulated by means of a second mass flow regulator 110.

The argon atoms are fired onto a sputtering target 111 made from silicon, and the doping gas is supplied through a condensation area 112 of the cluster ion source 100, so that starting from the sputtering target 111 an ion beam 113 which contains both the silicon ions and the ions of the doping gas is generated.

The ion beam is passed through a principal chamber opening 114 with a diameter of approximately 5 mm, with the result that the ion beam 113 is shaped in a predeterminable way.

Further adjustment of the beam profile of the ion beam 113 which is formed takes place through further openings 115, 116, 117 in further electrodes, the diameters of which openings are in each case approximately 5 mm, and by the different selection of the electric potentials which are applied to the electrodes.

By means of the openings 115, 116, 117, in each case one chamber is defined between the respective openings 115, 116, 117, namely:

an area which is formed between the principal chamber 103 and the first opening 115, as a first auxiliary chamber 118, a second auxiliary chamber 119, which is formed between the first opening 115 and the second opening 116, and a third auxiliary chamber 120 between the second opening 116 and the third opening 117.

In the text which follows, the way in which the cluster ion source 100 operates will be explained.

The free argon atoms are fired onto the sputtering target 111 via the first feed line 104, and what are known as fast silicon ions are generated by firing onto the sputtering target 109 (silicon sputtering target).

These free silicon atoms drift through the condensation area 112 in which they join together with the addition of the doping gas comprising boron atoms, to form larger groups, the ion clusters.

The ion clusters are typically formed in different sizes of from only a few atoms up to several thousand atoms, so that their diameters can be kept smaller than the known diameters of silicon islands which are generated in the usual way, for example using the known etching process.

In this way, depending on the number of atoms, it is possible to form ion clusters of sizes of up to a few nanometers.

The diaphragms which define the openings 112, 113, 114, 115 are used to shape, accelerate or decelerate and focus the ion clusters to form a sharply defined ion beam 121.

The electric potential which is applied to the further electrodes and an electric field in front of the target, which is explained in more detail below, makes it possible to deposit the ion clusters on a surface with an energy which can in principle be selected as desired.

The desired beam profile of the ion beam 113 can in principle be set as desired by suitably arranging the individual diaphragms and selecting the electric potential on these diaphragms.

The sharply defined ion beam 121, which still contains a large number of ion clusters of different sizes and therefore different masses, is passed through a mass separator 122, i.e. a device for mass separation, as described in [3].

The respective pressure prevailing in the auxiliary chambers 118, 119, 120 is maintained by further turbomolecular pumps 123, 124, 125, which are in each case connected to the auxiliary chambers 118, 119, 120.

The device for mass separation 122 has now made it possible to generate a resulting ion beam 126 which has the ion clusters of the desired mass and therefore of the desired size and the desired number of ions, i.e. the silicon atoms and the boron doping atoms.

The ion clusters are applied, on a substrate 128 which is held in a mount 127, to a first electrode 129 and a second electrode 130, both of which have been prefabricated on the substrate 128.

Figure 2:
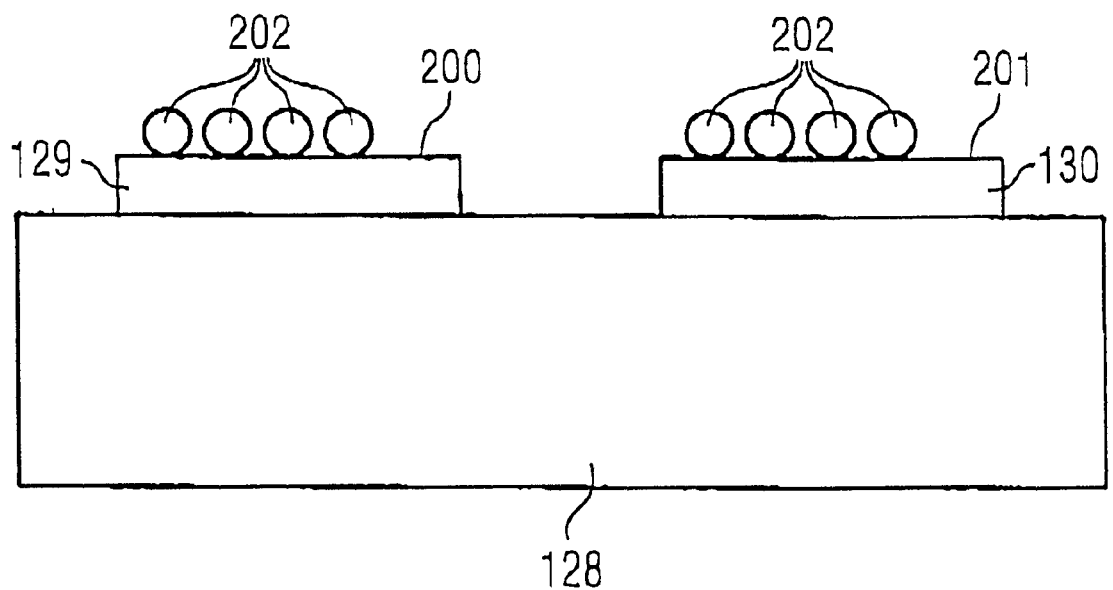
FIG. 2 shows a cross section through an electronic component having two electrodes with a roughened electrode surface in accordance with an exemplary embodiment of the invention.

Therefore, as illustrated in FIG. 2, the electrode surface 200 of the first electrode 129 and/or the electrode surface 201 of the second electrode 130 is roughened by the ion clusters 202 in a manner which can be set very precisely, so that it is possible to generate an enlarged electrode surface area 200 of the first electrode 129 and/or an enlarged electrode surface area 201 of the second electrode 130.

In order not to destroy the electrode surface 200, 201, the ion clusters 202 which are to be deposited on the first electrode 129 and/or the second electrode 130, before impinging on the respective electrode surface 200, 201, are decelerated by means of an oppositely directed electric field, diagrammatically indicated by an arrow 131 in FIG. 1.

Furthermore, there is another turbomolecular pump 132, which is coupled to the deposition chamber 133 in which the mount 127 is arranged.

The required magnitude of the electric field which is applied is dependent on the desired energy of the ion clusters just before they impinge on the electrode surface 200, 201 and is to be determined experimentally.

If one assumes a desired density of ion clusters 202 on an electrode surface 200, 201 of approximately $10^{10}$ cm$^{-2}$, the result, with an assumed beam current of 1 pA, is a required radiation time of approximately 10 sec/mm$^2$.

The structuring of the electrode surfaces 200, 201 is suitable both for planar electrodes, as illustrated in FIG. 2, and for electrodes which are arranged in three-dimensional structures, for example in trenches of predeterminable depth.

For the deposition of ion clusters 202 on planar electrode surfaces 200, 201, shaping of the ion beam with a beam profile which is as wide as possible at the location of deposition, i.e. of incidence on the electrode surface 200, 201, is desirable.

During the deposition of ion clusters 202 within deep trenches, a focused, i.e. very sharply defined, cluster ion beam is desirable, which could either be directed in a controlled manner onto the location of the corresponding trench at which the ion cluster 202 is to be deposited in each case, or can be scanned across the entire electrode surface 200, 201.

The corresponding variability of the beam profile of the ion beam can be achieved by suitable selection of the ion-optical lenses which are provided in the beam path of the ion beam, and of the voltages applied to the ion-optical lenses.

In principle, further electronic components of any desired form, preferably DRAM memory elements and flash EEPROM memory elements, can be produced in further process steps from the electrodes 129, 130 which are embedded in the substrate 128 and have a roughened electrode surface 200, 201.

According to an alternative embodiment of the invention, what is known as a Wien filter is suitable as a device for mass separation 122.

Figure 3:
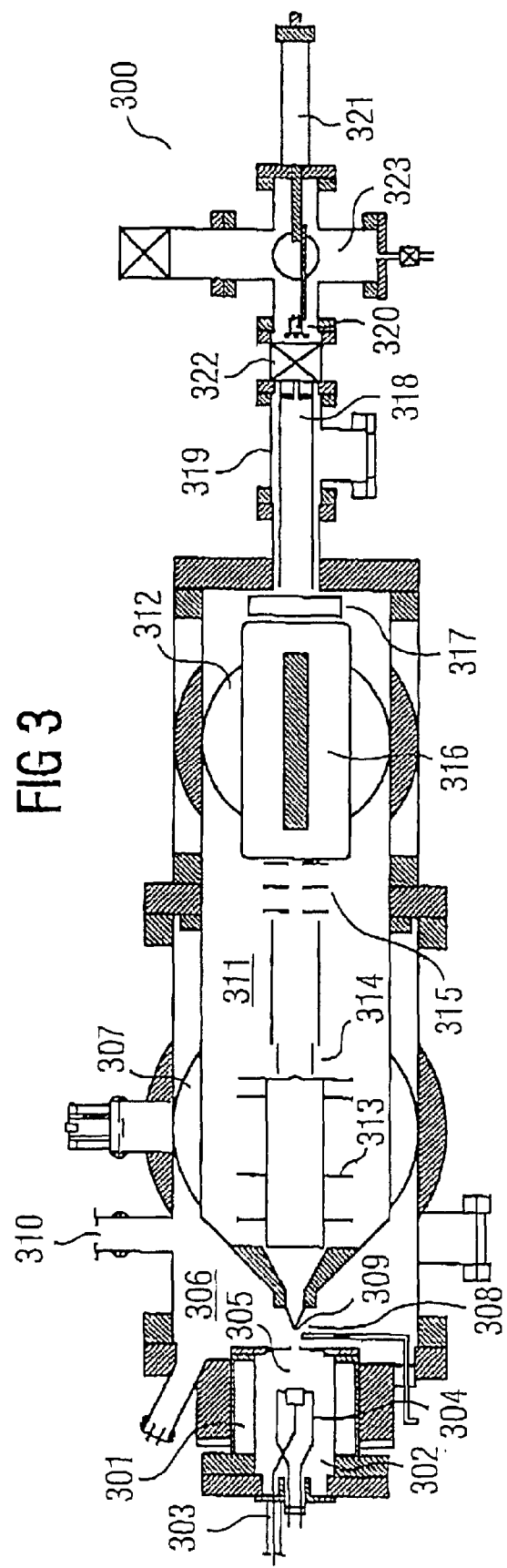
FIG. 3 shows a cluster ion source in accordance with a second exemplary embodiment of the invention, for producing an electrode arrangement with a roughened electrode surface.

A second cluster ion source 300 in accordance with a second exemplary embodiment of the invention is illustrated in FIG. 3.

Helium gas is passed by means of a feed line 303 into a principal chamber 302, which is provided with a cooling element 301, above a crucible 304, which contains silicon in the gas phase. The silicon gas in the crucible 104 is cooled by the helium and condenses to form clusters which are passed through a principal opening 305.

The clusters are passed into an area 306 which is held at a pressure of approximately $10^{-4}$ mbar by means of a diffusion pump 307.

The cluster beam which is formed is doped, using doping atoms, in accordance with this exemplary embodiment using boron atoms, by means of a cathode plasma generator 308.

Alternatively, according to the invention it is also possible, in particular, for the doping atoms phosphorus atoms, boron atoms, arsenic atoms, but also other doping atoms which are suitable for doping or further atoms which are to be introduced into a cluster, to be used as doping atoms.

The doped cluster ion beam 309 is passed through a mouthpiece opening 310, for focusing the cluster ion beam 309, into a high-vacuum area 311, which is connected to a further diffusion pump 312.

In the high-vacuum area 311, the doped cluster ion beam 309 is accelerated and is focused further in an acceleration area 313 and oriented in an X-Y deflector 314.

A lens 315 focuses the doped cluster ion beam 309 further, and the doped cluster ion beam which has been focused in this way is fed to a Wien filter 316 as mass selector.

A further Y-deflector 317 is used to direct the resulting cluster ion beam into the centre of the mass selection opening 318 at the end of a drift tube 319.

The mount 320 on which the substrate with the electrodes is arranged is positioned by means of a linear drive 321.

Furthermore, a valve 322 is provided between the drift tube 319 and the deposition chamber 323, for the purpose of controlling the cluster ion beam emerging from the Wien filter 316 and the drift tube 319.

The following publications are cited in this document:

[1] T. Hihara and K. Sumiyama, Formation and size control of a Ni cluster by plasma gas condensation, Journal for Applied Physics, Volume 84, No. 9, pp. 5270–5275, November 1998

[2] S. G. Hall, M. B. Nielsen and R. E. Palmer, Energetic impact of small Ag clusters on graphite, Journal for applied physics, Volume 83, No. 2, pp. 733–737, January 1998

[3] B. von Issendorff and R. E. Palmer, A new high transmission infinite range mass selector for cluster and nanoparticle beams, Review of Scientific Instruments, Volume 70, No. 12, pp. 4497–4501, December 1999

[4] I. M. Goldby et al., Gas condensation source for production and deposition of size-selected metal clusters, Rev. Sci. Instrum. 68, (9), 3327–3334, September 1997

LIST OF REFERENCE SYMBOLS

100 Cluster ion source
101 Housing for cluster ion source
102 Cooling water arrangement
103 Principal chamber
104 First feed line
105 First gas vessel
106 First mass flow regulator
107 Turbomolecular pump
108 Second feed line
109 Second gas vessel
110 Second mass flow regulator
111 Sputtering target
112 Condensation area
113 Cluster ion beam
114 Principal chamber opening
115 First opening
116 Second opening
117 Third opening
118 First auxiliary chamber
119 Second auxiliary chamber
120 Third auxiliary chamber
121 Sharply defined ion beam
122 Mass separator
123 Turbomolecular pump
124 Turbomolecular pump
125 Turbomolecular pump
126 Resulting ion beam
127 Mount
128 Substrate
129 First electrode
130 Second electrode
131 Arrow
132 Turbomolecular pump
200 Electrode surface of first electrode
201 Electrode surface of second electrode
202 Ion cluster 300 Cluster ion source
301 Cooling element
302 Principal chamber
303 Feed line
304 Crucible
305 Principal opening
306 Area
307 Diffusion pump
308 Cathode plasma generator
309 Doped cluster ion beam
310 Mouthpiece opening
311 High-vacuum area
312 Further diffusion pump
313 Acceleration area
314 X-Y deflector
315 Lens
316 Wien filter
317 Further Y-deflector
318 Mass selection opening
319 Drift tube
320 Mount
321 Linear drive
322 Valve
323 Deposition chamber

What is claimed is:

1. Process for producing a first electrode and a second electrode, in which the first electrode and the second electrode are provided from an electrode material, in which a cluster ion source is used to apply clusters of the electrode material to the first electrode and/or the second electrode.

2. Process according to claim 1, in which the electrode material used is semiconductor material.

3. Process according to claim 2, in which the electrode material used is silicon.

4. Process according to claim 3, in which the electrode material used is silicon doped with doping atoms.

5. Process according to claim 4, in which the doping atoms are added to the ion beam which is formed by the cluster ion source in the condensation area of the cluster ion source, with the result that the electrode material is provided.

6. Electronic component having a first electrode and a second electrode, in which the first electrode and the second electrode have been formed using the method according to claim 1.

7. Electronic memory element having a first electrode and a second electrode, in which the first electrode and the second electrode have been formed using the method according to claim 1.

8. Electronic memory element according to claim 7, in which the electronic memory element is a dynamic random access memory (RAM).

9. Electronic memory element according to claim 7, in which the electronic memory element is a flash EEPROM.

* * * * *

UNITED STATES PATENT AND TRADEMARK OFFICE
CERTIFICATE OF CORRECTION

PATENT NO.     : 6,548,341 B2
DATED          : April 15, 2003
INVENTOR(S)    : Margit Sarstedt It is certified that error appears in the above-identified patent and that said Letters Patent is hereby corrected as shown below:

<u>Title page,</u>
Item [75], Inventors, please correct the inventor's residence/city and nationality to read as follows:
-- Munchen (DE) --

Signed and Sealed this

Sixteenth Day of September, 2003

JAMES E. ROGAN
*Director of the United States Patent and Trademark Office*